(12) United States Patent
Sinanoglu

(10) Patent No.: US 7,930,607 B2
(45) Date of Patent: Apr. 19, 2011

(54) CIRCUIT FOR BOOSTING ENCODING CAPABILITIES OF TEST STIMULUS DECOMPRESSORS

(76) Inventor: Ozgur Sinanoglu, Safat (KW)

( * ) Notice: Subject to any disclaimer, the term of this patent is extended or adjusted under 35 U.S.C. 154(b) by 223 days.

(21) Appl. No.: 12/320,986

(22) Filed: Feb. 10, 2009

(65) Prior Publication Data

US 2010/0205492 A1    Aug. 12, 2010

(51) Int. Cl.
*G01R 31/28* (2006.01)
(52) U.S. Cl. ......................................................... 714/729
(58) Field of Classification Search .................. 714/728, 714/729
See application file for complete search history.

(56) References Cited

U.S. PATENT DOCUMENTS

| | | | |
|---|---|---|---|
| 6,968,489 B2* | 11/2005 | Motika et al. ................. | 714/728 |
| 7,197,721 B2* | 3/2007 | Patil et al. .......................... | 716/1 |
| 7,222,277 B2 | 5/2007 | Wang et al. | |
| 7,395,473 B2* | 7/2008 | Cheng et al. ................... | 714/729 |
| 7,451,373 B2* | 11/2008 | Poehl et al. ..................... | 714/740 |
| 7,487,420 B2* | 2/2009 | Keller ............................. | 714/732 |
| 7,512,851 B2* | 3/2009 | Wang et al. ..................... | 714/726 |
| 7,526,696 B2* | 4/2009 | Xiang et al. .................... | 714/726 |
| 7,797,603 B2* | 9/2010 | Rajski et al. ................... | 714/738 |
| 2005/0010853 A1* | 1/2005 | Duvant et al. .................. | 714/792 |
| 2006/0101316 A1* | 5/2006 | Wang et al. ..................... | 714/726 |
| 2007/0283200 A1 | 12/2007 | Casarsa | |
| 2008/0313513 A1* | 12/2008 | Gizdarski ....................... | 714/729 |
| 2010/0100781 A1* | 4/2010 | Wohl et al. ..................... | 714/728 |

* cited by examiner

*Primary Examiner* — James C Kerveros
(74) *Attorney, Agent, or Firm* — Richard C. Litman

(57) ABSTRACT

The circuit for boosting encoding capabilities of test stimulus decompressors is utilized in conjunction with a stimulus decompressor. The circuit, called align-encode is inserted between the decompressor and internal. The scan chains feed into a response compactor. The align-encode circuit is used to judiciously manipulate care bit distribution. Re-configurability of the align-encode circuit allows for this manipulation via delay cells with the align-encode circuit, whose length can be adjusted on a per scan chain per test pattern basis by loading the align-encode circuit with proper control data. Based on the stimulus decompressor characteristics, the scan chains are delayed in such a way that an unencodable pattern becomes encodable when using the align-encode circuit.

9 Claims, 7 Drawing Sheets

| ARCH. | SCAN-IN CHANNELS | p=0.01 | | p=0.02 | | p=0.03 | | p=0.04 | |
|---|---|---|---|---|---|---|---|---|---|
| | | ORIGINAL | ALIGN-ENCODE | ORIGINAL | ALIGN-ENCODE | ORIGINAL | ALIGN-ENCODE | ORIGINAL | ALIGN-ENCODE |
| 64x64 | 4 | 215 | 999 | 4 | 932 | 0 | 545 | 0 | 68 |
| | 8 | 483 | 999 | 60 | 991 | 3 | 891 | 0 | 617 |
| | 16 | 728 | 999 | 277 | 996 | 60 | 974 | 5 | 912 |
| | 32 | 898 | 999 | 658 | 999 | 405 | 994 | 219 | 985 |
| 128x128 | 8 | 3 | 984 | 0 | 457 | 0 | 0 | 0 | 0 |
| | 16 | 66 | 996 | 0 | 901 | 0 | 349 | 0 | 7 |
| | 32 | 328 | 999 | 6 | 987 | 0 | 828 | 0 | 449 |
| | 64 | 669 | 1000 | 177 | 997 | 22 | 975 | 0 | 892 |

Fig. 6

| ARCH. | SCAN-IN CHANNELS | p=0.01 | | p=0.02 | | p=0.03 | | p=0.04 | |
|---|---|---|---|---|---|---|---|---|---|
| | | ORIGINAL | ALIGN-ENCODE | ORIGINAL | ALIGN-ENCODE | ORIGINAL | ALIGN-ENCODE | ORIGINAL | ALIGN-ENCODE |
| 64x64 | 4 | 20.2 | 92.0 | 0.4 | 85.8 | 0.0 | 50.2 | 0.0 | 6.3 |
| | 8 | 42.3 | 85.6 | 5.3 | 84.9 | 0.3 | 76.4 | 0.0 | 52.9 |
| | 16 | 54.6 | 72.9 | 20.8 | 72.7 | 4.5 | 71.1 | 0.4 | 66.6 |
| | 32 | 44.9 | 47.6 | 32.9 | 47.6 | 20.3 | 47.3 | 11.0 | 46.9 |
| 128x128 | 8 | 0.3 | 91.4 | 0.0 | 42.5 | 0.0 | 0.0 | 0.0 | 0.0 |
| | 16 | 5.8 | 86.3 | 0.0 | 78.0 | 0.0 | 30.2 | 0.0 | 0.6 |
| | 32 | 24.6 | 73.9 | 0.5 | 73.1 | 0.0 | 61.3 | 0.0 | 33.2 |
| | 64 | 33.5 | 48.8 | 8.9 | 48.7 | 1.1 | 47.6 | 0.0 | 43.5 |

Fig. 7

CIRCUIT FOR BOOSTING ENCODING CAPABILITIES OF TEST STIMULUS DECOMPRESSORS

BACKGROUND OF THE INVENTION

1. Field of the Invention

The present invention relates to encoding problems of test stimulus decompressors in scan-based testing. More specifically, the present invention relates to a circuit for boosting encoding capabilities of test stimulus decompressors.

2. Description of the Related Art

In order to reduce test time and data volume, a stimulus decompressor is inserted on-chip between a tester channels and a scan chain inputs. This enables an on-chip expansion of compressed stimulus into a test pattern to be applied to a chip being tested. The position of the care bits of the test pattern determines whether a particular decompressor is capable of delivering the test pattern intact into the scan chains. If a test pattern test cannot be delivered through the decompressor, it is either replaced by other deliverable patterns or an additional test application phase is employed where the decompressor is bypassed, delivering the pattern without performing compression. Consequently, test quality degrades and test cost increases.

Scan-based testing is widely adopted, in the industry, wherein a large number of scan cells coupled with a large set of scan patterns reflect into inflated test data volume and prolonged test application times. To alleviate the associated costs, test data compression solutions are employed.

Test stimuli compression techniques that are based on the encoding of individual test vectors have been proposed so as to reduce test data volume and possibly test application time. Broadly, the proposed techniques can be categorized as lossless and lossy. Lossless compression techniques deliver perfect test vector encodability by construction. While lossless techniques ensure preservation of fault coverage levels, the stringency of the constraints may impact the compression ratios attained. The lossy test data compression schemes, on the other hand, can still deliver high compression ratios with no test quality degradation by employing an additional phase with no compression or by incorporating Automatic Test Pattern Generation or ATPG into compression.

Some of the lossless test data compression techniques are based on coding schemes. While these techniques can deliver the actual test vectors intact, the indeterminacy in the expansion ratio of the codewords imposes significant synchronization problems. Other lossless compression techniques, such as Linear Feedback Shift Register or LFSR reseeding, have been utilized to deliver fault coverage attained in deterministic tests. In these techniques, a seed transmitted from the tester into the on-chip LFSR is expanded into a test vector to be delivered. To ensure a perfect mapping from LFSR seeds onto every test vector, the LFSR to be utilized on-chip needs to be of a significant size. Techniques such as LFSR seed reordering and a variable number of smaller seed utilization have been proposed to improve LFSR size, test time, and data volume aspects of LFSR reseeding approaches.

Another approach, called SmartBIST, utilizes single input shift registers that drive an XOR network, which in turn feeds internal scan chains. But, the encodability of any pattern is only guaranteed by freezing the internal chains while loading the shift registers in certain cycles. Thus, this approach necessitates the costly implementation of clock gating.

Implementation of the scan architecture in the form of a tree has been another approach for reducing the scan depth, the test time, and data volume. In this technique, all the scan cells in the same level of the tree receive an identical stimulus bit. However, to avoid loss of coverage, the scan cells that are stimulus-compatible need to be placed in the same level of the scan tree. The problem with this approach is that response collection from the scan tree becomes a bottleneck.

Furthermore, such architecture requires that the further away the compatible scan cell group form a scan-in pin, the larger the size of the group. This should result in monotonically increasing sized groups that are levelized from the scan-in pin towards the scan-out pin. But, the architecture fails in real designs, because the size of the compatible scan cell group varies and grouping of scan cells with no regards to scan cell positions is not allowed, due to routing constraints.

Some of the lossy compression techniques are based on limited scan chain access, such as a control of a single chain with deterministically generated test data or the broadcast of the same data into all the scan chains, known as the Illinois scan architecture. Other techniques include the use of a linear decompression network, which can be combinational or sequential. To compensate for the losses, these techniques have to utilize an additional compression-free phase, a test generation, or even include searching for alternative encodable test vectors, because of the missed faults.

Re-configurable fan-out networks, such as a multiplexer-based or switch-based network, have also been used. In these schemes, one of multiple possible parallel broadcast configurations is selected for the application of a test vector by controlling the appropriate select signals. One such architecture offers flexibility in switching from one configuration to another and the delivery of a test vector is accomplished by controlling the appropriate select signals. Another architecture switches from one configuration to another between the shift cycles of the same test vector. However, the problem with each one of these test stimulus compression techniques is that there is a test vector encoding limitation, because these compression techniques do not have the capability of manipulating the care bit distribution.

As has been discussed, the prior art has mostly focused on the design of stimulus decompressors, rather than finding solutions to improve the encodability of decompressors. In fact, the use of stimulus decompressors is de facto in scan-based testing today due to the unbearable cost of testing. These stimulus decompressors can be combinational such as fan-out based, XOR-based, multiplexer-based, or sequential such as phase shifters, LFSRs, etc. Every decompressor has a certain encoding capability, wherein the encodability of a test pattern depends on whether the care bit distribution matches with the structure of the decompressor.

Thus, a circuit method for boosting the encoding capabilities of test stimulus decompressors solving the aforementioned problems is desired.

SUMMARY OF THE INVENTION

The circuit for boosting the encoding capabilities of test stimulus decompressors, by receiving a test pattern from the decompressor and judicially manipulating it prior to sending the test pattern to a plurality of scan chains.

There is at least one care bit that forms the test pattern. A software-based analysis of the care bits of a test pattern reveals whether the test pattern is encodable. The nature of this analysis that will be explained hereinafter is determined by the type of the decompressor. The align-encode circuit receives the test pattern and determines from a position of the at least one care bit during the cycle whether the test stimulus decompressor is delivering the test pattern unencodable into the scan chains.

Based on the determination that the test pattern is unencodable, the align-encode circuit injects delay cells on some of the scan-in paths, where the control data determines which scan-in paths are injected with a delay cell. This operation manipulates the unencodable test pattern into an encodable test pattern and the encodable test pattern is then sent to the scan chains.

The circuit has a plurality of delay registers and one of the delay registers is connected to an input of one of the scan chains. The delay register is for delaying the scan chain for one cycle, based on the at least one control data. There is also a plurality of multiplexer. Each of the multiplexers is being driven by the respective delay register for the scan chain and is for choosing between a single cycle delay and no delay.

The circuit has at least one control register connected to the respective multiplexer for determining whether the delay register is inserted on the particular scan chain. At least one control shift register is connected to the at least one control register. The control shift register is for receiving the control data during the shift cycles, and the content of the control shift register is copied into the control register during the captured cycle.

At least one delay channel input is connected to the control shift register and serially controls the control shift register. The delay channel input is directly controlled by the control data and is for enabling an adjustment of the delay of individual scan chains with the control data being serially shifted into the control shift registers, and subsequently loading into the control registers during the capture cycle.

A clock signal provides to the delay register associated with the particular scan chain a cycle signal to drive the scan chain, so the delay register constitutes an extension of the particular chain. A global scan-enable signal is part of the align-encode circuit as a reset input for the delay registers. The global scan-enable signal drives the reset input for gating-off the clock input of the control registers during shift cycles and gating-off the clock input of the control shift registers, during the capture cycle.

The present invention can be extended by supporting the delay of scan-in paths by up to a plurality of cycles. In that case, a plurality of delay registers, control shift registers, and control registers are required per scan chain.

These and other features of the present invention will become readily apparent upon further review of the following specification and drawings.

BRIEF DESCRIPTION OF THE DRAWINGS

FIG. 6 is a table showing test pattern encodability results without versus with the present invention based on a number of encodable patterns out of one thousand randomly generated patterns according to the present invention.

FIG. 7 is a table showing test data volume reduction results, in percentages, for two-phase test application according to the present invention.

Similar reference characters denote corresponding features consistently throughout the attached drawings.

DETAILED DESCRIPTION OF THE PREFERRED EMBODIMENTS

The present invention relates to a circuit for boosting encoding capabilities or test pattern delivery capabilities in stimulus decompressors.

Figure 1:
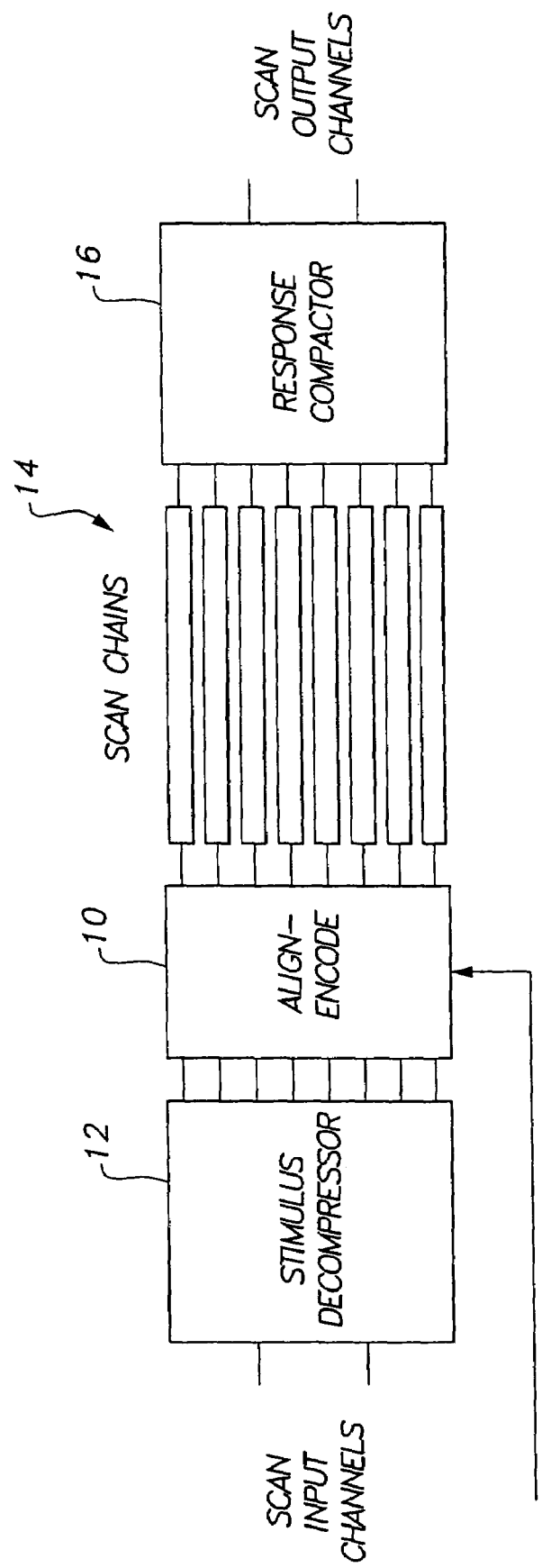
FIG. 1 illustrates a scan chain architecture implemented with an align-encode circuit according to the present invention.

More specifically, as shown in FIG. 1, a hardware circuit, labeled as align-encode circuit 10, is utilized in conjunction with a stimulus decompressor 12 in order to enhance the encoding capability of the decompressor 12. The align-encode circuit 10 is inserted between the decompressor 12 and internal scan chains, generally indicated with numeral 14. The scan chains feed into a response compactor 16. The align-encode circuit 10 is used to judiciously manipulate care bit distribution. Re-configurability of the align-encode circuit 10 allows for this manipulation via delay cells within the align-encode circuit 10, whose length can be adjusted on a per scan chain per test pattern basis by loading the align-encode circuit 10 with proper control data. Based on the stimulus decompressor 12 characteristics, the scan chains 14 are delayed in such a way that an unencodable pattern becomes encodable when using the align-encode circuit 10.

The alignment operation of the align-encode circuit 10 is done on a per test pattern basis. Also, depending on the particular distribution of care bits within the test pattern, any of the scan chains 14 may be delayed in order to be able to encode the test pattern. Thus, align-encode circuit 10 is re-configurable on a per test vector per scan chain basis.

In test data compression, correlated test data delivery to scan cells is inevitable. The encoding capability of the test pattern is a matter of whether the care bit distribution within the test pattern complies with the correlation induced by the stimulus decompressor 12. In the case of combinational decompressors, each scan slice can be analyzed individually and independently to judge the encoding capability of the test vector.

Figure 2A:
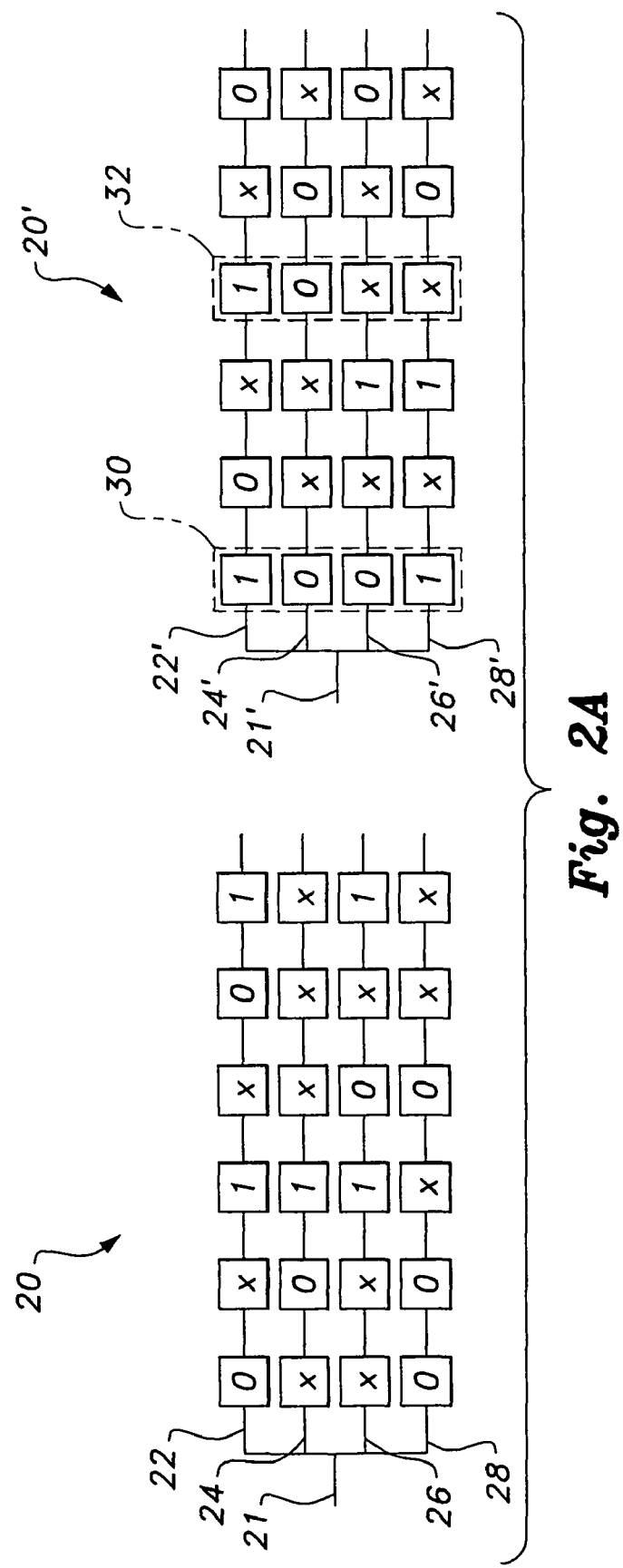
FIG. 2A illustrates an encodable and unencodable test patterns in a fan-out decompression circuitry.
Figure 2B:
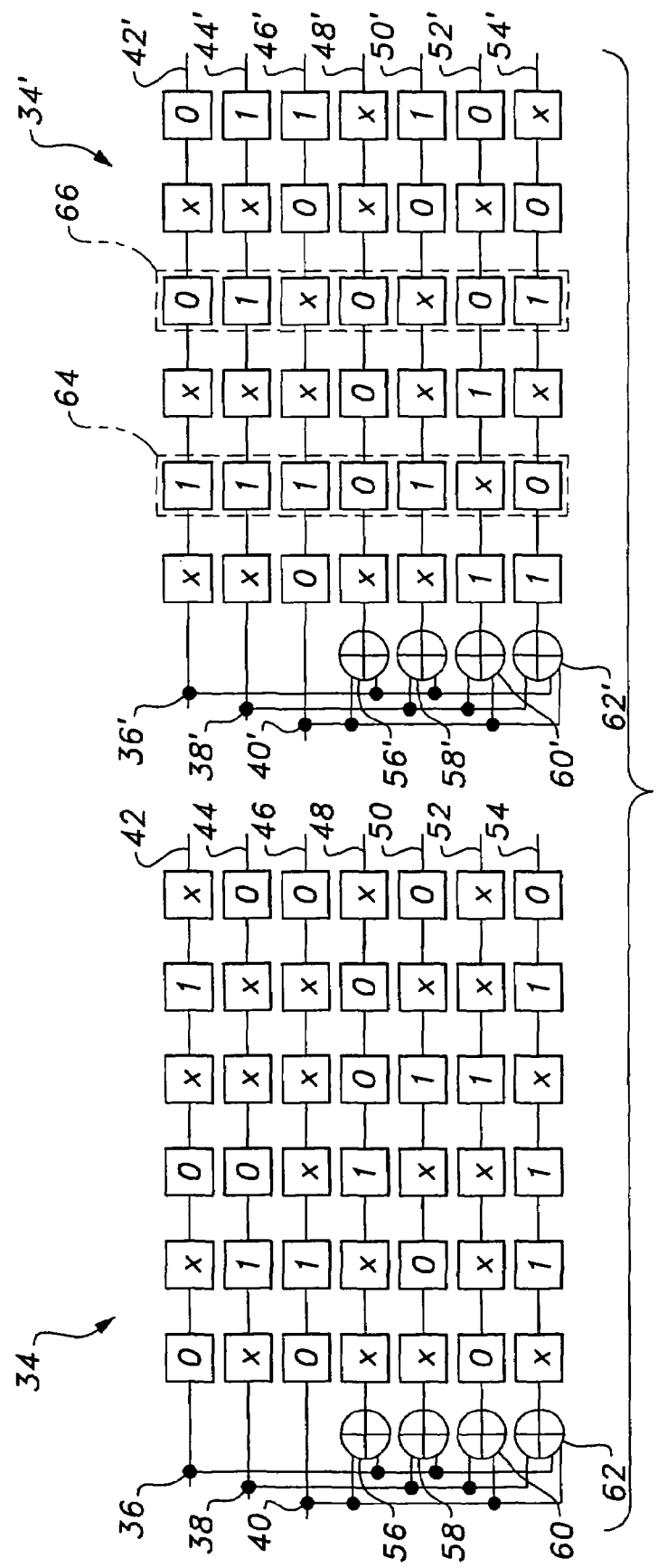
FIG. 2B illustrates an encodable and unencodable test patterns in a XOR-based decompression circuitry.

As an example of a test pattern delivered without the align-encode circuit 10, attention is directed to FIGS. 2A, and 2B. Here, one encodable test pattern and one unencodable test pattern are provided for a fan-out based decompressor. The care bit distribution for the first test pattern is indicated with the number 20, and the care bit distribution for the second test pattern is indicated with the number 20'. While the test pattern 20 is encodable and can be delivered into scan chains 22, 24, 26, 28, the test pattern of 20' is not encodable and thus can not be delivered into chains 22', 24', 26', 28'. Thus, the decompressors 20 and 20' and their components are the same only the test pattern is different wherein an encodable test pattern is delivered to the fan-out decompressor 20, and an unencodable test pattern is delivered to the decompressor 20'.

As seen with the encodable test pattern in care bit distribution 20, identical care bits within every slice constitute the encodability requirement. The encodable pattern with care bit distribution 20 passes the encodability check, since no slice contains both 0's and 1's. However, the unencodable pattern with care bit distribution 20' fails due to first slice 30 and fourth slice 32, because these two slices 30, 32 consist of both 0's and 1's.

The encodability check is easier with a fan-out decompressor. But, it can also be done with a XOR-based decompressor. In FIG. 2B, an encodability check is done with a XOR-based decompressor.

A XOR decompressor necessitates solving a linear equation for each care bit in order to perform an encodability check. In FIG. 2B, the XOR decompressors are the same, but the care bit distribution indicated with number 34 leads to an encodable test pattern delivered and care bit distribution 34' leads to an unencodable test pattern.

In FIG. 2B, there are three channels 36, 38, 40 driving seven scan chains 42, 44, 46, 48, 50, 52, 54. The first, second and third chains 42, 44, 46 receive a value inserted from the first, second and the third channels 36, 38, 40, respectively. The fourth, fifth and sixth chains 48, 50, 52 receive values from XOR 56, 58, 60 inserted between two of three channels. In other words, the XOR 56 receives values from the channels 36, 40, the XOR 58 receives values from the channels 36, 38, and the XOR 60 receives values from the channels 38, 40. The seventh chain 54 receives values from the XOR 60 inserted between all three channels 36, 38, 40. Care bits within each slice should be consistent with the outlined XOR correlation in order for the test pattern to be encodable.

Accordingly, one linear equation is formed for each care bit in a slice. These equations consist of three variables corresponding to the three bits to be shifted from the three channels 36, 38, and 40. The pattern care bit distribution 34 is encodable, as the slices from left to right can be encoded as 000, 111, 001, 010, 111, and 000, respectively.

With respect to the care bit distribution 34', the same XOR-based decompressor as in care bit distribution 34 is used.

As can be seen, the pattern in the care bit distribution 34' is unencodable however, due to second slice 64 and fourth slice 66. Thus, the system of linear equations is unsolvable with these two slices 64, 66.

The distribution of care bits can be judiciously manipulated in order to improve test vector encodability. The manipulation of the care bit distribution can be achieved through delaying the shift-in operation of scan chains for the proper alignment of scan slices.

Figure 3A:
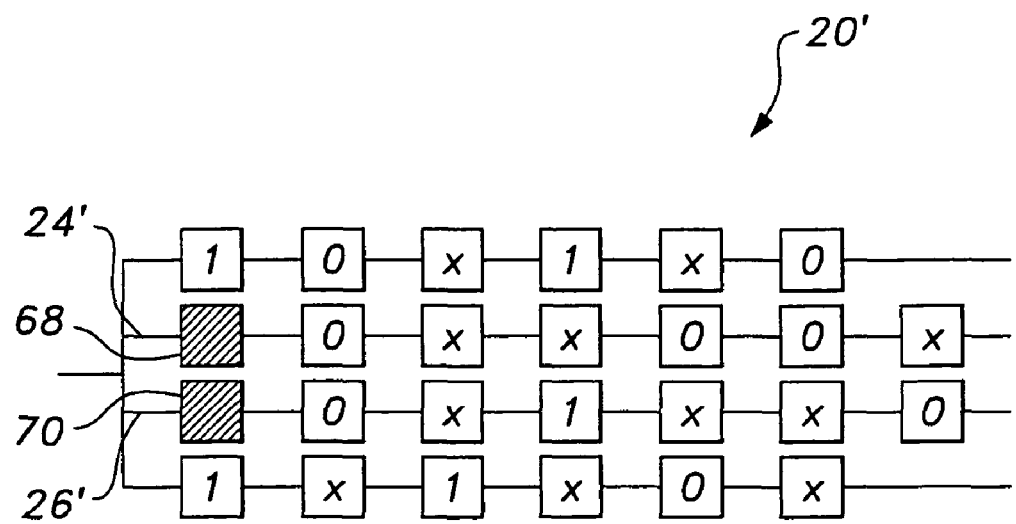
FIG. 3A illustrates a delaying of shift-in operations for ensuring encodability using a fan-out decompression circuitry according to the present invention.
Figure 3B:
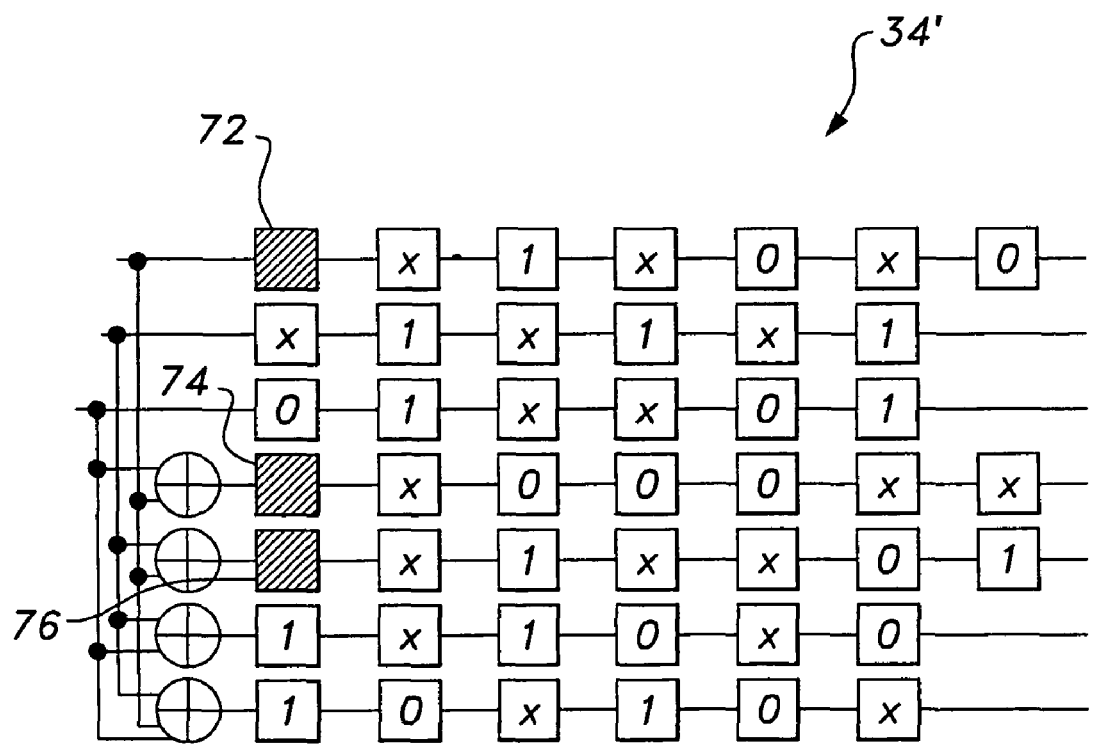
FIG. 3B illustrates a delaying of shift-in operations for ensuring encodability using a XOR-based decompression circuitry according to the present invention.

In FIGS. 3A and 3B, the two unencodable test vector examples from FIGS. 2A and 2B are used to demonstrate the beneficial impact of shift-in delay operations. The shift-in of the two scan chains 24', 26' in the middle is delayed by a single cycle each in order to manipulate the care bit distribution 20' from FIG. 2A. Such an alignment ensures the encodability of the test vector, as each newly formed slice becomes encodable. Thus, each slice in FIG. 3A has all 0's or 1's but not both.

The shift-in of the first, fourth, and fifth scan chains is delayed by a single cycle each, delivering the encodability of the originally unencodable pattern with care bit distribution 34' from FIG. 3B.

Figure 4:
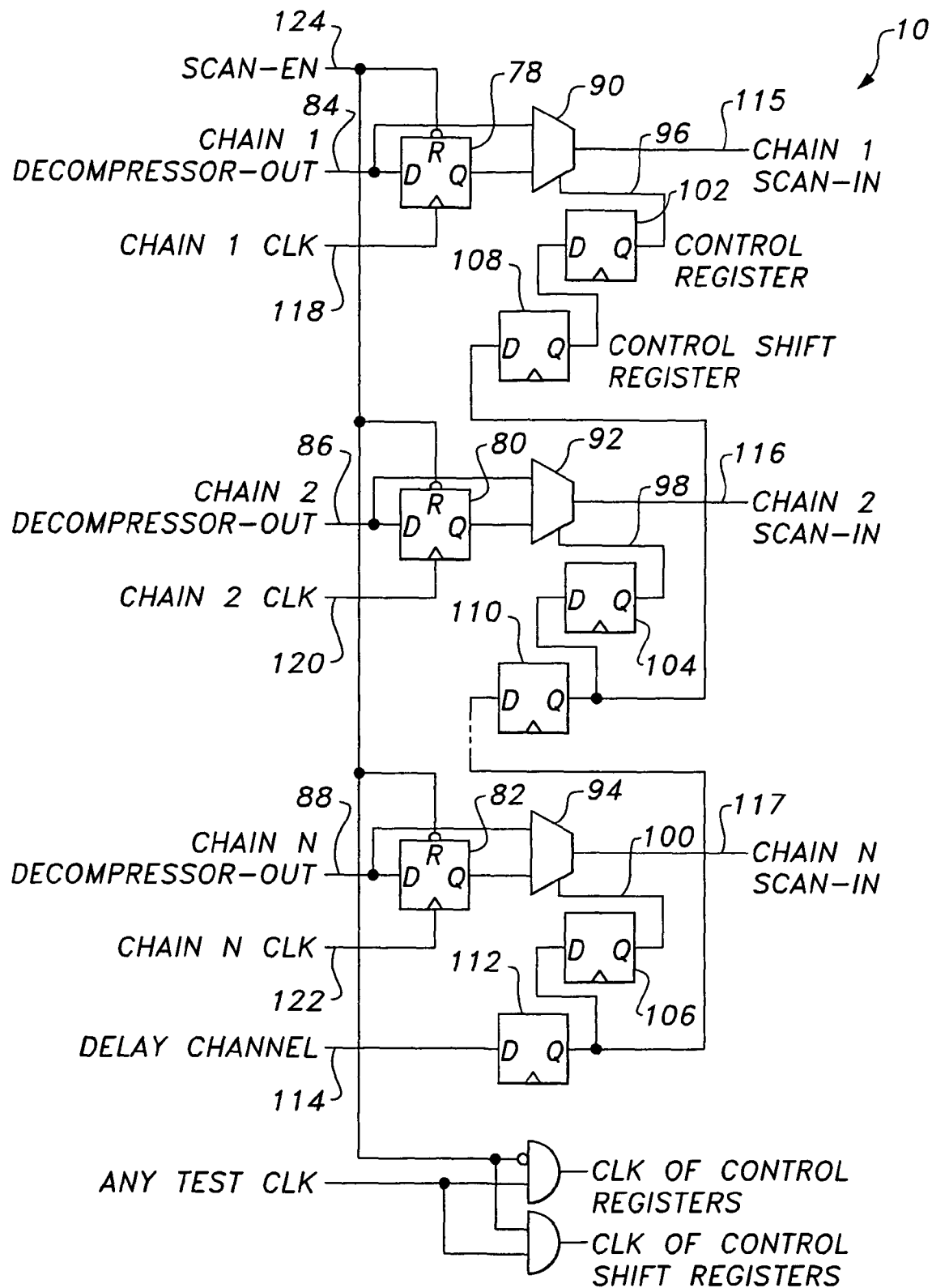
FIG. 4 illustrates the align-encode circuit of FIG. 1 according to the present invention.

The align-encode circuit 10 design implementation details are shown in FIG. 4. In this implementation, one resettable flip-flop, denoted as delay register 78, 80, 82, is utilized for every scan chain 1, 2, N in order to be able to delay the chain for one cycle. The delay register 78, 80, 82 associated with each chain 1, 2, N is connected to the input 84, 86, 88 of the corresponding scan chain 1, 2, N. A multiplexer 90, 92, 94 driven by the respective delay register 78, 80, 82 for the particular chain 1, 2, N helps choose between a single cycle delay and no delay. A select input 96, 98, 100 of the respective multiplexer 90, 92, 94 is driven by another flip-flop, denoted as control register 102, 104, 106, whose value determines whether the delay register 78, 80, 82 is inserted on the scan-in path of the particular scan chain 1, 2, N. Any chain can be delayed by a single cycle, as every scan chain 1, 2, N has the dedicated control register 102, 104, 106. The control registers 102, 104, 106 are updated only during the capture cycle with new values that have been shifted into another set of registers, denoted as control shift registers 108, 110, 112.

The reason for utilizing a distinct set of registers is due to the fact that the content of the control registers 102, 104, 106 should be preserved throughout scan operations for a test pattern. All the control shift registers 108, 110, 112 within the align-encode circuit 10 are connected into a single chain that is serially controllable via a delay channel input 114. This input 114 is directly controlled by a tester, enabling on a per test pattern basis the adjustment of the delay of individual scan chains 1, 2, N. The associated control data is serially shifted into the control shift registers 108, 110, 112 during shift cycles concurrently with the shifting-in of the scan stimuli through the scan-in channels 115, 116, 117, and is subsequently loaded into the control registers 102, 104, 106 during the capture cycle.

The invention can be extended by supporting the delay of scan-in paths by up to a plurality of cycles. In that case, the number of delay registers that are required per scan chain equals the number of maximum allowable delay cycles. Both the number of control shift registers and the number of control registers equal the logarithm of the number of maximum allowable delay cycles. The described procedure of loading and updating the control data remains the same.

It is typically the case that a length of the control shift register 108, 110, 112 chain is less than the scan depth, having no impact on the number of shift-cycles per pattern. For instance, for scan architecture of 100 scan chains, each with a depth of 1000, the number of control shift registers equals 100. In the rare event in which the control shift register 108, 110, 112 chain is longer than the scan depth, the depth increase problem can be mitigated as will be explained hereinafter.

A clock signal provided to the delay register 78, 80, 82 associated with the particular scan chain 1, 2, N is the same test clock that drives the scan cells of this chain, as the delay register 78, 80, 82 constitutes an extension of the particular chain 1, 2, N.

The global scan-enable signal 124 drives the active-low asynchronous reset input of the delay registers 78, 80, 82. During the capture cycle, as this signal 124 is de-asserted, all the delay registers 78, 80, 82 are reset (initialized to known values). This initialization helps prevent complications in response compaction, as otherwise unknown values would be generated in the delay registers 78, 80, 82, propagating through the compactor 16, shown in FIG. 1, and corrupting the compacted signature. The scan-enable signal 124 is also used to gate-off the clock input of the control registers 102, 104, 106 during shift cycles and control shift registers 108, 110, 112, during the capture cycle. This insures that the control shift registers 108, 110, 112 preserve their content which is loaded into the control registers 102, 104, 106 within the capture cycle, while in shift cycles, the control registers 102, 104, 106 preserve their content. The align-encode circuit 10 delays only the shift-in operations for the selected chains. Thus, the scan-out of the responses is not affected, as the delay registers 78, 80, 82 of the align-encode circuit 10 are inserted on the shift-in path only.

The align-encode circuit 10 does not necessarily have to be implemented as a hard block. An align-encode netlist may be merged into a design netlist at a RT or gate level, enabling the proper physical placement of align-encode logic, and thus preventing any potential placement and routing issues.

The care bit distribution in each test pattern is analyzed to compute the proper delay values that lead to the encoding of the test pattern. It is possible that no delay assignment exists for the encoding of the pattern. If that is the case, the pattern remains unencodable, necessitating either a subsequent serial application or replacement with other encodable patterns. An input to the analysis is a scan pattern. The target of this analysis is the computation of the proper delays, either 0 or 1, for each scan chain so that the pattern becomes encodable in the new alignment of the slices. Therefore, the analysis should be repeated for each scan pattern in order to compute the proper delay data for the entire test set.

A test pattern analysis is set out hereinafter for fan-out decompressors. Of course, this analysis can also be extended for XOR-based decompressors, but is not included herein. The align-encode circuit 10 provides the capability of delaying any chain by a single cycle. Full exploration of the search space in order to find the proper delay values requires an exponential time complexity solution, because $2^n$ different configurations exist for n chains.

With no chains delayed, the encodability requirement is simply that no slice includes both 0 and 1, as illustrated with the fan-out decompressor in FIG. 2A. Two scan chains are compatible, if no 0-1 bit conflict exists in any bit position. The align-encode circuit 10 enables the exploitation of other forms of compatibility. If two chains that are equally delayed are compatible, this compatibility is referred to as iso-delay compatible. If two chains are compatible when only one of the chains is delayed by a cycle, this compatibility is referred to as anti-delay compatible. There are two different forms of anti-delay compatibility for a pair of chains, as the two chains may become compatible when one chain or the other is delayed. Thus, two chains may be both iso-compatible and anti-compatible at the same time, while they may also be neither, since this is dictated by the care bit distribution.

From a given scan pattern to be delivered into a given scan architecture, a compatibility graph that captures all the aforementioned forms of compatibility is formed. Two nodes are created for each scan chain; node $v_i$ denotes that chain i is delayed for one cycle, while node $\tilde{v}_i$ denotes a 0-delay for chain i. An edge is placed between two nodes $v_i$ and $v_j$ and another edge between $\tilde{v}_i$ and $\tilde{v}_j$, if chains i and j are iso-delay compatible. An edge is placed between $v_i$ and $\tilde{v}_j$, if chains i and j are compatible when chain i is delayed and chain j is not. Analogous condition determines whether an edge is placed between $v_j$ and $\tilde{v}_i$. These two edge types represent anti-delay compatibility. No edge is placed between $v_i$ and $\tilde{v}_i$ for any i.

Figure 5:
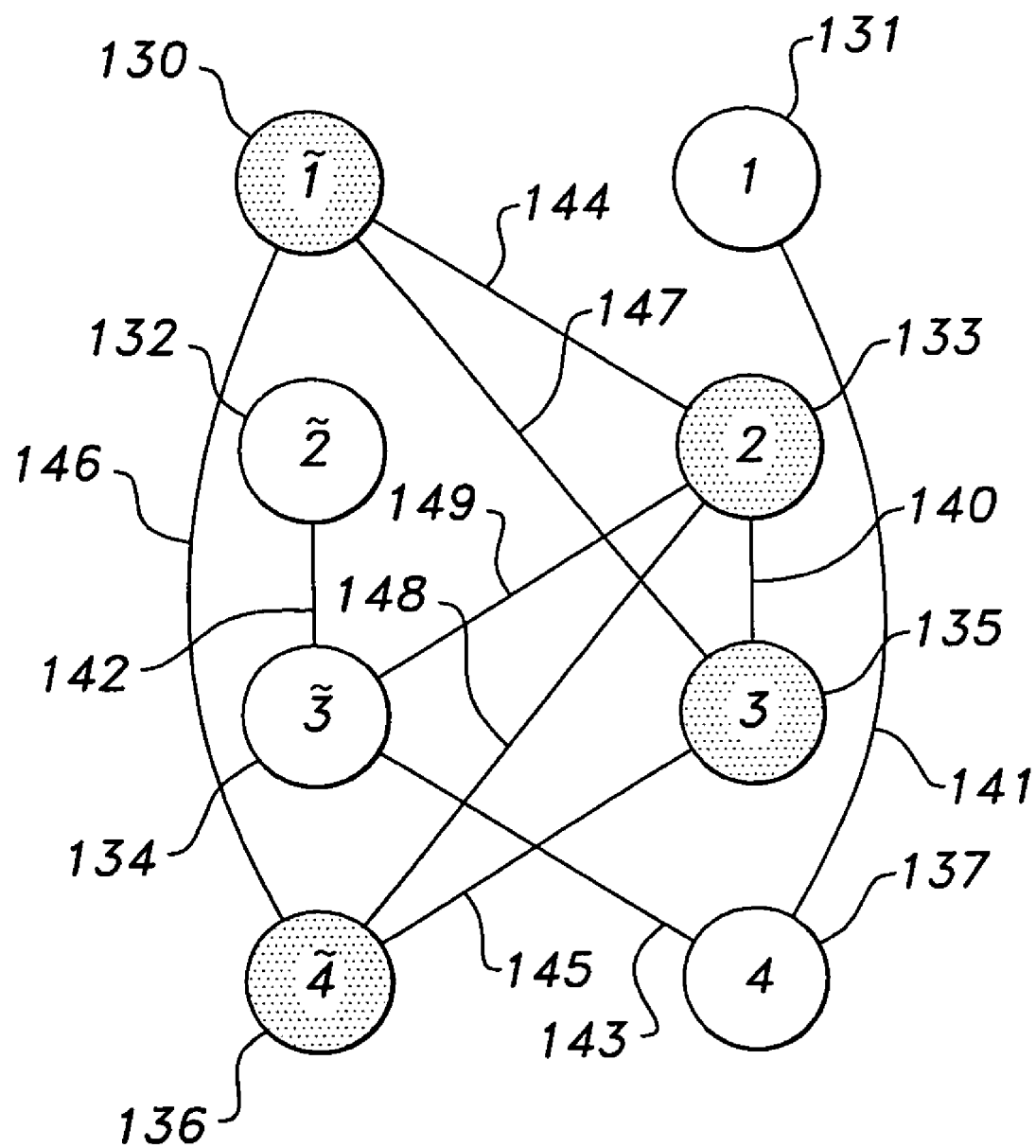
FIG. 5 shows a compatibility graph for the unencodable test pattern in FIG. 2A.

A compatibility graph is shown in FIG. 5 for the originally unencodable test pattern care bit distribution 20' from FIG. 2A. Two nodes are created for each chain, resulting in eight nodes in total for four chains. The nodes on the left 130, 132, 134, 136 denote 0-delay for the associated chains, while the nodes on the right 131, 133, 135, 137 denote 1-delay for the corresponding chains. For instance, nodes 133 and 135 are connected by an edge 140, as these two chains are iso-compatible. For the same reason, the nodes 132 and 134 are connected by an edge 142 as well. The nodes 133 and 130 are connected by an edge 144, as the two chains become compatible only when the second chain is delayed by one cycle. Similarly, all the other edges 141, 143, 145, 146, 147, 148, 149 in the graph are added.

The delay assignment solution exists if any only if a clique of size n exists in the compatibility graph, where n is the number of scan chains, which equals half the number of nodes in the graph. A clique of size n denotes that there is a delay assignment that leads to all-pair-wise compatible chains, where the delay of each chain is determined based on which node for the chain is included in the clique. If $v_i$ is included, then chain i is delayed by one cycle; otherwise, (if $\tilde{v}_i$ is included), chain is not delayed. As there are no edges between node $v_i$ and $\tilde{v}_i$ a clique of size n must include exactly one of $v_i$ and $\tilde{v}_i$. The same reason implies also that the maximum clique size cannot exceed n.

In the compatibility graph illustrated in FIG. 5, there exists a size 4 clique. The nodes 130, 133, 135, 136 in the clique are shaded. The particular solution in this case, see the manipulated care bit distribution 20' in FIG. 3A, indicates that by delaying only chains 2 and 3, indicated by 24', 26', the originally unencodable pattern becomes encodable.

Design changes late in the design flow are quite common, and are implemented in the form of Engineering Change Orders (ECOs). The ECOs that do not require the re-stitching of the scan chains have no impact on the align-encode circuit 10 or hardware, which remains intact. The ATPG has to be executed on the design modified by the ECO, however, and, align-encode delay data is recomputed, which is achieved quickly by the maximum clique heuristic.

The align-encode circuit 10, as shown in FIG. 4, consists of flip-flops and multiplexers for the most part. The number of flip-flops equals 3n, where n is the number of scan chains. The number of multiplexers equals n. The area overhead of Align-encode, which consists only of 3 flip-flops and 1 multiplexer per scan chain, is very small, and becomes negligible for larger designs.

Delay of the scan chains may potentially incur one additional shift cycle for the complete scan-in of test vectors. This can be eliminated by exploiting the scan chain length differences and by preventing the delay of the longest chain(s). It should be noted that the delay of the shorter chains can be hidden. Also, test data volume penalty occurs due to the additional delay information that is shifted in from the delay channel. The number of additional bits per test pattern equals the number of control registers within the align-encode circuit 10, which is n. Accordingly, as the number of encodable test patterns is increased by the align-encode circuit 10, test quality in the form of both modeled and unmodeled fault coverage is enhanced, if scan compression mode is the only test mode in test application.

As the number of encodable test patterns is increased, more faults are detected in the scan compression mode. As a result, fewer test patterns remain to be serially applied, resulting in test time and data volume reduction, offsetting or even exceeding the test time and data volume situation mentioned previously.

As the align-encode circuit 10 delivers enhanced encodability of test patterns, more aggressive compression of test stimuli can be pursued. In the presence of the align-encode circuit 10, the decompressor 12 that is driven by fewer tester channels can be utilized, yet delivering the same test quality level. Thus, a low cost tester that has a lower pin count can be utilized, as scan channels are reduced. Furthermore, as stimuli are further compressed, test data volume is reduced. Alternatively, same number of tester channels can be utilized, but for driving a larger number of scan chains. The scan depth can thus be reduced, lowering test time also, offsetting or even exceeding the test time and data volume situation mentioned earlier.

In view of FIGS. 6 and 7, the align-encode circuit 10 technique has been implemented and applied to randomly generated test data in order to gauge its effectiveness. It should be noted that in order to gauge impact of the align-encode circuit 10, a comparison is made with the encoding capability of a decompressor with versus without the presence of the align-encode circuit 10.

Two scan architectures were utilized. In the first architecture, 64 scan chains, each with 64 scan cells exist, while the second architecture consists of 128 scan chains with a scan depth of 128 scan cells. For each of the architecture, four different fan-out decompressors were utilized. For the smaller architecture, the decompressors are 4, 8, 16 and 32 scan-in channels, respectively, and fan out to 64 scan chains. For the larger architecture and decompressor combination, a test vector set of 1000 patterns was randomly generated, with a given care bit probability, assuming identical probabilities for 0 and 1 bits. Four different care bit probabilities 0.01, 0.02, 0.03, and 0.04 were used. The number of test patterns that were encodable in the absence of the align-encode circuit 10 versus the presence of the align-encode circuit 10 were computed and compared.

The pattern encodability results are provided in FIG. 6. For each architecture-decompressor combination, and for each care bit probability, the number of encodable patterns out of 1000 patterns is provided for the original architecture with no align-encode circuit 10, and for the architecture with the align-encode circuit 10. These numbers, in pairs, are provided in Columns 3 through 10 in the table. As can be observed from the results in the table, utilization of the align-encode circuit 10 delivers a tremendous raise in encodability levels.

In one case wherein 8 channels fan out to 128 scan chains, the number of encodable patterns (care bit density of 0.01) is increased from 3 to 984. In another case, wherein 64 channels fan out to 128 scan chains, 892 patterns (care bit density of 0.04) become encodable due to the delay capability that the align-encode circuit 10 provides, while without the align-encode circuit 10 no patterns are encodable. In other words, the align-encode circuit 10 transforms a poor decompressor into a powerful one. In general, the align-encode circuit 10 can significantly enhance the encodability of any decompressor, which in turn reflects into test quality enhancements if scan compression mode is the only test mode.

With reference to FIG. 7, it is quite common to employ a second test application phase subsequent to a scan compression mode. In the first phase, encodable patterns are delivered into the shorter scan chains through a decompressor, while in the latter phase, shorter scan chains are concatenated into fewer longer ones and the remaining test patterns, which were unencodable in the first phase, are inserted into these longer scan chains, wherein the decompressor block is bypassed. Thus, the per pattern shift cycles increases in the second phase.

The results shown in FIG. 6 are utilized, in order to compare the test data volumes of the architecture without versus with the align-encode circuit 10 in a two-phase test application process. No compression of test patterns (all serial application) is referred to as the base case in the computations. The percentage reductions in test data volume delivered by the decompressor alone and by the decompressor along with the align-encode circuit 10 are provided.

Test data volume reductions in a two-phase test application process are shown in FIG. 7. Test data volume results are computed by adding up the test data volume of the two phases. Test data volume of the base case is computed as a product of the number of scan chains, the number of test patterns, which is 1000, and the scan depth. Test data volume of the first phase in the case of no align-encode circuit 10 is computed as the product of the number of scan-in channels, the number of encodable patterns and the scan depth. Test data volume of the first phase of the align-encode circuit 10 is also computed. It is computed as (channels +1)×(depth+1)× encodable_patterns. The second phase test data volume is computed identically for both cases. It is computed as the product of the number of scan chains, the number of unencodable test patterns, and scan depth. The delay information and one additional cycle per pattern are also accounted.

As fewer test patterns are applied in the second phase, the align-encode circuit 10 delivers significant test data volume reductions. The reductions delivered overcome the penalty incurred-due to the insertion of the delay data and to one additional shift cycle for each pattern. In one case, wherein 8 channels drive 128 scan channels for a care bit density of 0.01, test data volume reduction of a fan-out decompressor is increased from 0.3% to 91.4%. In general, the test data volume reduction delivered by any decompressor can be significantly increased via the utilization of the align-encode circuit 10 in conjunction.

It is to be understood that the present invention is not limited to the embodiment described above, but encompasses any and all embodiments within the scope of the following claims.

I claim:

1. A circuit for boosting encoding capabilities of a test stimulus decompressor, comprising:
a plurality of scan chains receiving a test pattern from the test stimulus decompressor over a plurality of shift cycles;
at least one care bit forming the test pattern;
an align-encode circuit for connecting between the test stimulus decompressor and the plurality of scan chains, the align-encode circuit receiving the test pattern and further receiving control data, said control data being computed based on the position of the least one care bit of the test pattern, the align-encode circuit delaying at least one fragment of the test pattern based on the control data to manipulate the test pattern into an encoded test pattern, and sending the manipulated encoded test pattern to the scan chains;
a plurality of delay registers with at least one delay register being connected to an input of one of the scan chains, the at least one delay register delaying the scan chain for a selected number of delay cycles based on the at least one control data; and
a plurality of multiplexers being driven by the respective delay registers for the scan chain for insertion of the selected number of delay cycles.

2. The circuit for boosting encoding capabilities of a test stimulus decompressor according to claim 1,
wherein the selected number of cycles is in a range between zero cycles and a maximum number of delay cycles, which is equal to the number of delay registers.

3. The circuit for boosting encoding capabilities of a test stimulus decompressor according to claim 2, further comprising:
at least one control register connected to the respective multiplexer for determining the number of delay registers being inserted on the particular scan chain.

4. The circuit for boosting encoding capabilities of a test stimulus decompressor according to claim 3, further comprising:
at least one control shift register connected to the at least one control register and for receiving the control data during shift cycles in order to update the control register during a capture cycle.

5. The circuit for boosting encoding capabilities of a test stimulus decompressor according to claim 4, further comprising:
a delay channel input connected to the control shift register for serially controlling the control shift register and the delay channel input being directly controlled by the control data for enabling an adjustment of the delay of individual scan chains with the control data being serially shifted into the control shift registers, and subsequently loading into the control registers during a capture cycle.

6. The circuit for boosting encoding capabilities of a test stimulus decompressor according to claim 5, further comprising:
a global scan-enable signal; and
a reset input for the delay registers, the global scan-enable signal for driving the reset input for gating-off the clock input of the control registers during shift cycles and gating-off the clock input of the control shift registers, during the capture cycle.

7. The circuit for boosting encoding capabilities of a test stimulus decompressor according to claim 1, further comprising:
a clock signal for providing to the delay register associated with the particular scan chain and driving the scan chain, so the delay register constitutes an extension of the particular chain.

8. The circuit for boosting encoding capabilities of a test stimulus decompressor according to claim 4, wherein the at least one control register comprises a plurality of control registers and the at least one control shift register comprises a plurality of control shift registers.

9. The circuit for boosting encoding capabilities of a test stimulus decompressor according to claim 8, wherein the number of control shift registers and the number of control registers are both equal to the logarithm of the maximum number of delay cycles.

* * * * *